United States Patent [19]
Kanehachi

[11] Patent Number: 5,442,210
[45] Date of Patent: Aug. 15, 1995

[54] SEMICONDUCTOR DEVICE

[75] Inventor: Kaoru Kanehachi, Tokyo, Japan

[73] Assignee: Nippon Precision Circuits Inc., Tokyo, Japan

[21] Appl. No.: 144,935

[22] Filed: Oct. 28, 1993

[30] Foreign Application Priority Data

Nov. 12, 1992 [JP] Japan .................................. 4-302420

[51] Int. Cl.6 ........................ H01L 29/78; H01L 27/10
[52] U.S. Cl. .................................... 257/296; 257/298; 257/306; 257/315; 257/321
[58] Field of Search ............... 257/296, 298, 306, 314, 257/315, 316, 321

[56] References Cited

U.S. PATENT DOCUMENTS 5,196,722  3/1993  Bergendahl et al. ............... 257/304
5,290,725  3/1994  Tanaka et al. ...................... 257/296

Primary Examiner—Mark V. Prenty
Attorney, Agent, or Firm—Jordan and Hamburg

[57] ABSTRACT

A semiconductor device has a DRAM portion forming a cache memory and a flash memory portion fabricated on a common substrate, fabricated by a process based on the process of fabricating the flash memory portion. An electrode layer common to capacitors of the DRAM portion and a floating gate layer of the flash memory portion are formed simultaneously from the same material. An electrode layer of the upper capacitor of the DRAM portion, a gate electrode layer for a transistor of the DRAM portion, and a control gate layer of the flash memory portion are formed simultaneously from the same material.

7 Claims, 5 Drawing Sheets

SEMICONDUCTOR DEVICE

FIELD OF THE INVENTION

The present invention relates to a semiconductor device.

BACKGROUND OF THE INVENTION

It is common practice to use a hard disk for storing programs and data in a computer. Such a hard disk is heavy, has a large volume, and consumes a large amount of electricity. On the other hand, if a flash memory is used instead of a hard disk, a cache memory is needed. This cache memory is externally attached to the flash memory.

Accordingly, when a flash memory is used instead of a hard disk, the number of components, the weight, the volume, the cost, and the data transfer time are increased because a cache memory is an externally attached component.

SUMMARY OF THE INVENTION

It is an object of the present invention to provide a semiconductor device which, when used with an apparatus such as a computer, is capable of transferring data at a high speed and of reducing the number of components, the weight, the volume, and the cost.

In the semiconductor device according to the present invention, a DRAM portion and a flash memory portion are both formed on the main surface of the same semiconductor substrate.

DESCRIPTION OF THE PREFERRED EMBODIMENTS

Figure 5:
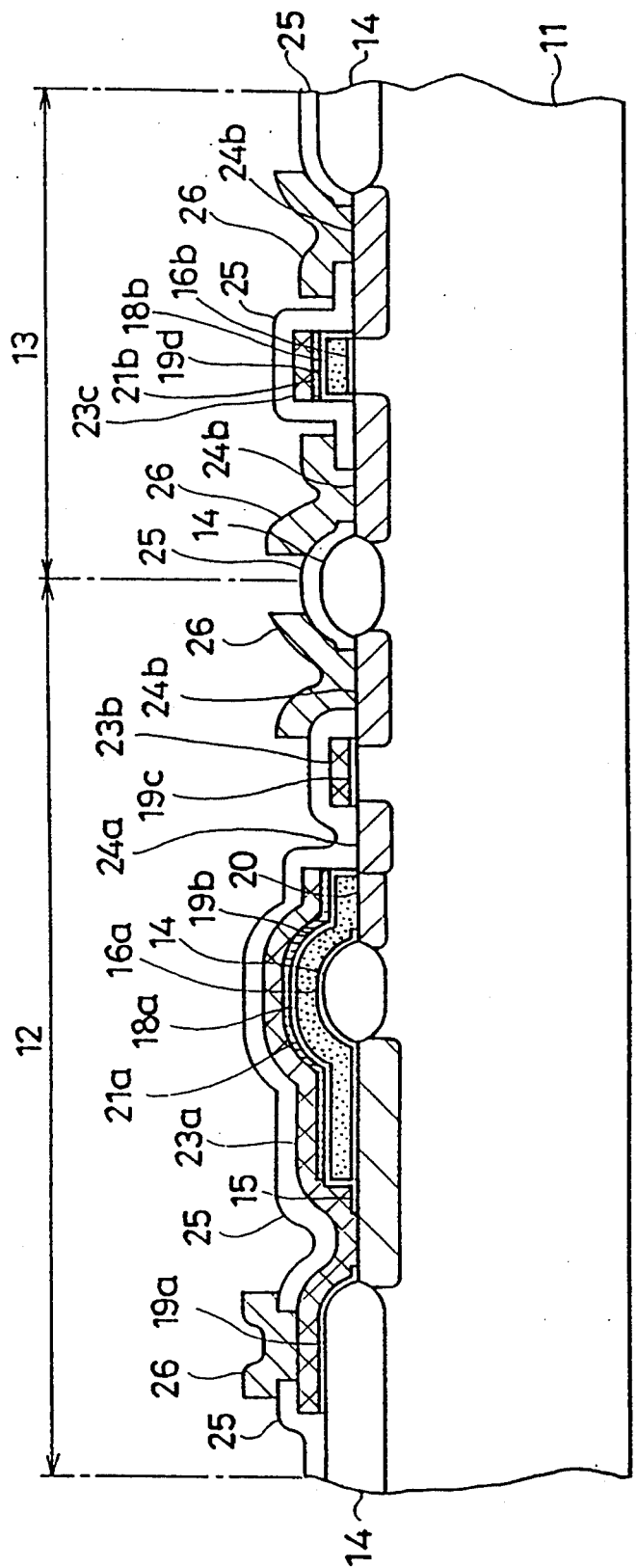
FIG. 5 is a schematic cross-section of the semiconductor device shown in FIG. 1, illustrating a yet further step.

FIG. 5 is a schematic cross-section of a semiconductor device according to the present invention. A semiconductor substrate 11 is made of a P-type silicon wafer. A DRAM portion 12 and a flash memory portion 13 are formed on the same semiconductor substrate 11. Reference numeral 14 indicates an ordinary LOCOS oxide film. The DRAM portion 12 has a heavily doped, P-type diffused layer 15 that is formed by ion implantation or another method. The layer 15 forms a first electrode layer of a lower capacitor in the DRAM portion 12. First insulating layers 16a and 16b are formed by a conventional thermal oxidation method. In the DRAM portion 12, the first insulating layer 16a forms an insulating layer of the lower capacitor. In the flash memory portion 13, the first insulating layer 16b forms a tunnel oxide film. Second electrode layers 18a and 18b are fabricated from polycrystalline silicon or the like by CVD or another process. The second electrode layers 18a and 18b are doped to be N-type by ion implantation techniques or other techniques. In the DRAM portion 12, the second electrode layer 18a acts as an electrode layer common to both lower and upper capacitors. In the flash memory portion 13, the second electrode layer 18b acts as a floating gate layer.

Second insulating layers 19a, 19b, 19c, and 19d are formed by normal thermal oxidation techniques. In the DRAM portion 12, the second insulating layer 19a forms a part of an insulating layer between a third electrode layer 23a and the silicon substrate 11. In the DRAM portion 12, the second insulating layer 19b forms a part of the insulating layer of the upper capacitor. In the DRAM portion 12, the second insulating layer 19c forms a layer insulating the gate of a transistor. In the flash memory portion 13, the second insulating layer 19d forms a part of an insulating layer between the floating gate layer 18b and a control gate layer 23c. A heavily doped, N-type diffused layer 20 is formed in the substrate by solid phase diffusion out of the second electrode layer 18a.

Third insulating layers 21a and 21b are formed by a combination of a normal thermal oxidation method and a CVD method. In the DRAM portion 12, the third insulating layer 21a forms a part of the insulating layer of the upper capacitor. In the flash memory portion 13, the third insulating layer 21b forms a part of an insulating layer between the floating gate layer 18b and the control gate layer 23c. The third electrode layers 23a, 23b, and 23c are fabricated from polysilicon or the like by CVD or another process. The third electrode layers 23a, 23b, and 23c are doped to be P-type by ion implantation. In the DRAM portion 12, the third electrode layer 23a forms the other electrode layer 23a of the upper capacitor. In the DRAM portion 12, the third electrode layer 23b forms a gate electrode layer of the transistor. In the flash memory portion 13, the third electrode layer 23c forms a control gate layer. Heavily doped, N-type diffused layers 24a and 24b form the source and the drain, respectively, of the transistor, and are fabricated by ion implantation. A fourth insulating layer 25 is an interlayer insulating layer that is fabricated from silicon oxide or the like by CVD or another process. A fourth electrode layer 26 is a metal layer which consists mainly of Al and is formed by sputtering or another method. Those elements which are indicated by like reference numerals are made of like materials and are formed simultaneously.

FIGS. 1–5 sequentially depict a method for fabricating the semiconductor device of the invention.

Figure 1:
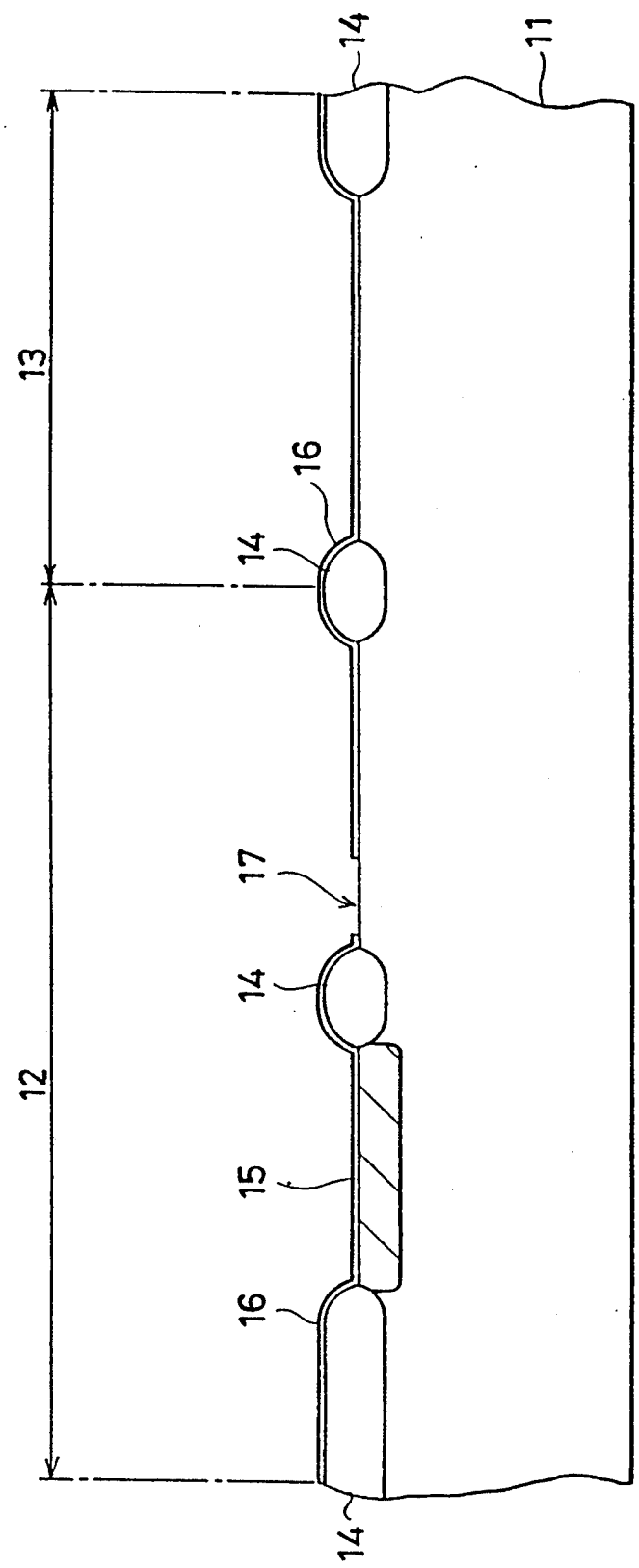
FIG. 1 is a schematic cross-section of a semiconductor device, illustrating one fabrication step.

Referring to FIG. 1, a LOCOS oxide film 14 is formed on the main surface of the semiconductor substrate 11. The heavily doped, P-type diffused layer 15 of the DRAM portion 12 is formed by normal photolithographic and ion implantation steps. The first insulating layer 16 is formed using a conventional thermal oxidation method. The first insulating layer 16 is etched by conventional photolithographic and etching steps to form a contact hole 17.

Figure 2:
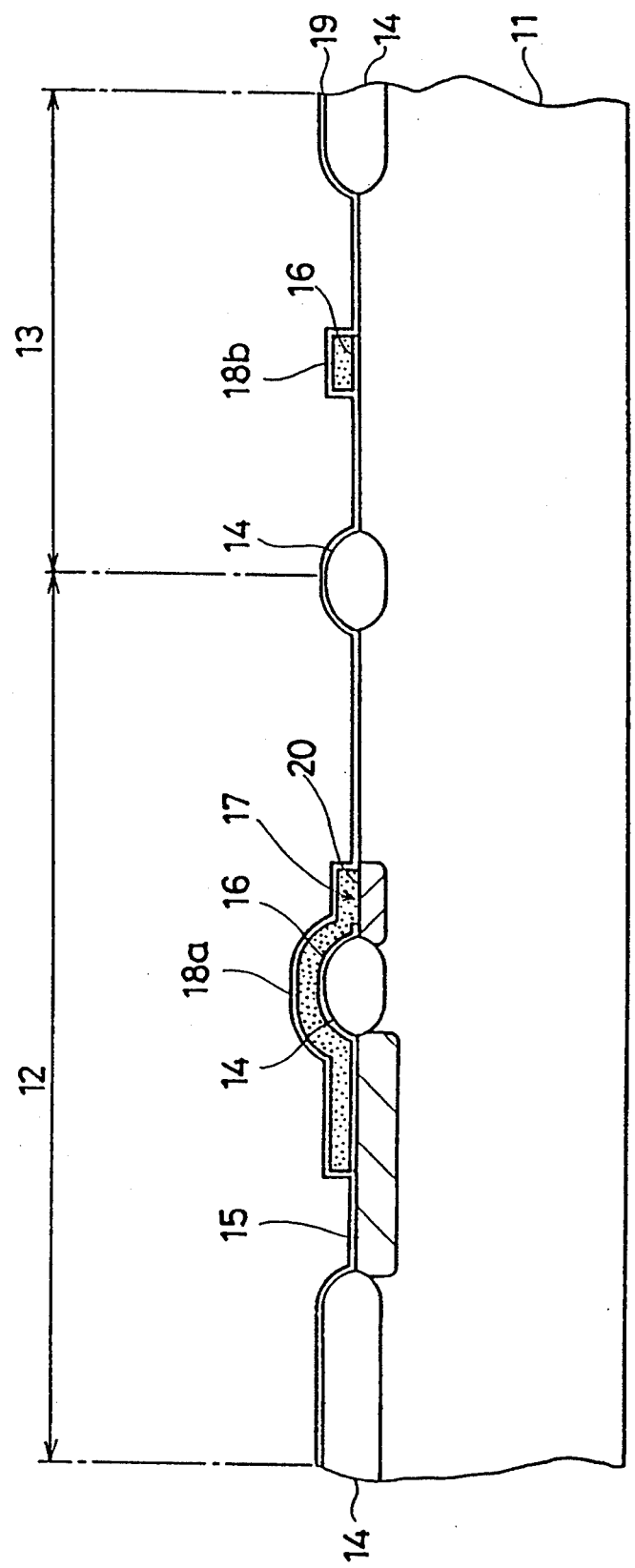
FIG. 2 is a schematic cross-section of the semiconductor device shown in FIG. 1, illustrating another step.

Referring to FIG. 2, a polycrystalline silicon film is fabricated by CVD or another method. An N-type impurity such as phosphorus or arsenic or the like is implanted into the whole surface of the polysilicon film by ion implantation. The polysilicon film is etched by conventional photolithographic and etching steps to form the second electrode layers 18a and 18b. The second insulating layer 19 is formed by a conventional thermal oxidation process. At this time, the impurity diffuses from the second electrode layer 18a into the semiconductor substrate 11 through the contact hole 17, thus forming the heavily doped, N-type diffused layer 20 in the semiconductor substrate 11.

Figure 3:
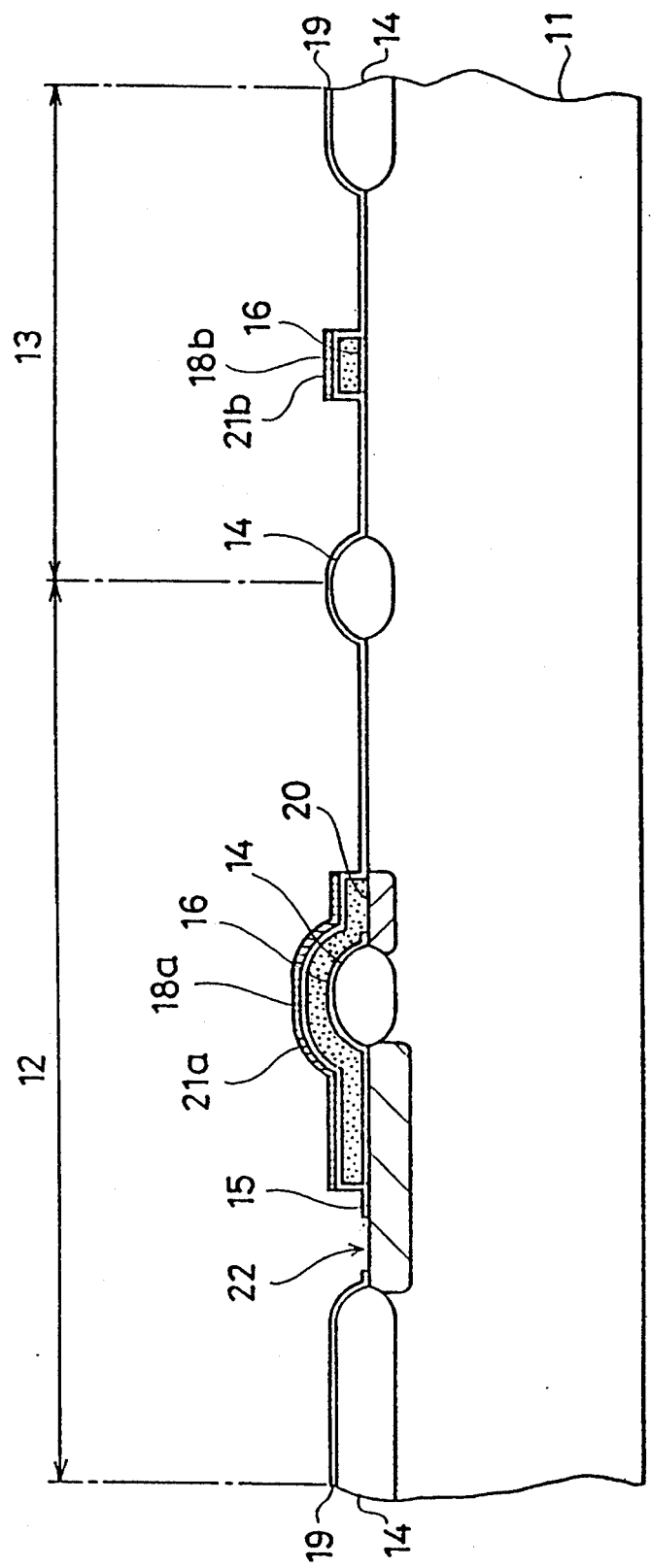
FIG. 3 is a schematic cross-section of a semiconductor device shown in FIG. 1, illustrating a further step.

Referring to FIG. 3, an ONO film is formed by a combination of a conventional thermal oxidation step and a conventional CVD step. The third insulating layers 21a and 21b are formed by conventional photolithographic and etching steps. The first insulating layer 16 and the second insulating layer 19 are etched by conventional photolithographic and etching steps to form a contact hole 22.

Figure 4:
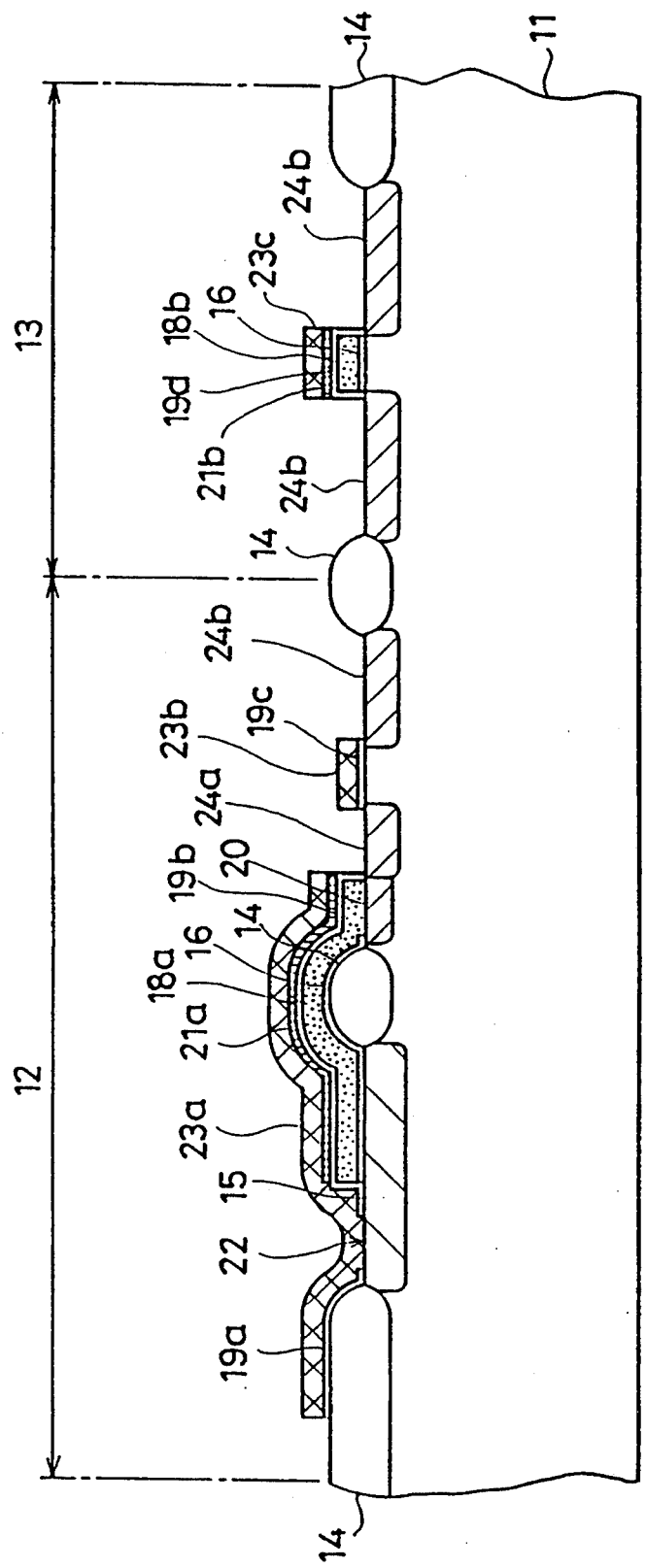
FIG. 4 is a schematic cross-section of the semiconductor device shown in FIG. 1, illustrating a still further step.

Referring to FIG. 4, a polysilicon film is formed by CVD or the like. A P-type impurity such as boron or the like is implanted into the whole surface of the polysilicon film by ion implantation. The polysilicon film is etched by conventional photolithographic and etching steps to form third electrode layers 23a, 23b, and 23c. An N-type impurity is implanted into the source and drain of the transistor by conventional photolithographic and ion implantation techniques. The laminate is thermally treated. Thus, the third electrode layer 23a can make a good contact with the semiconductor substrate 11 through the contact hold 22. At the same time, the N-type impurity in the source and drain of the transistor are activated, so that the heavily doped, N-type diffused layers 24a and 24b are formed. This heavily doped, N-type diffused layer 24a is electrically connected to the adjacent heavily doped, N-type diffused layer 20.

Referring to FIG. 5, the fourth insulating layer 25 is formed by CVD or another method. A contact hole (to which no numeral is given) is formed by conventional photolithographic and etching steps. The fourth electrode layer 26 is formed by sputtering or another method.

In the semiconductor device of the invention, the DRAM portion 12 is formed, based on the process of fabricating the flash memory portion 13. Therefore, the common electrode layer 18a of the capacitors in the DRAM portion 12 and the floating gate layer 18b of the flash memory portion 13 are simultaneously fabricated from the same material. The electrode layer 23a of the upper capacitor of the DRAM portion 12, the gate electrode layer 23b of the transistor of the DRAM portion 12, and the control gate layer 23c of the flash memory portion 13 are simultaneously fabricated from the same material. Consequently, the DRAM portion 12 and the flash memory portion 13 can be formed on the same semiconductor substrate simply by adding the following three steps:

(1) The step of forming a heavily doped, P-type diffused layer 15 in the DRAM portion 12 needs one glass mask for transferring a pattern.

(2) The step of forming a contact hole 17 for connecting the common electrode layer 18a of the capacitors in the DRAM portion 12 with the heavily doped, N-type diffused layer 20 in the DRAM portion 12 requires one glass mask for transferring a pattern.

(3) The step of forming a contact hole 22 for connecting the other electrode layer 23a of the upper capacitor in the DRAM portion 12 with the heavily doped, P-type diffused layer 15 in the DRAM portion 12 necessitates one glass mask for transferring a pattern.

A DRAM portion and a flash memory portion fabricated on the same semiconductor substrate by these three additional steps has arrayed memory elements to form large-scale memories. Peripheral circuits are also formed on the same semiconductor substrate. One or more of these semiconductor devices can constitute a single system performing functions comparable to or exceeding those of a single hard disk.

It is to be understood that the present invention is not limited to the above embodiment but rather it can embrace other kinds of transistors, plural layers or metallization, and various resistor layers other than the fundamental elements shown in FIG. 1. In the above embodiment, N-type transistors are used in DRAM portions. P-type transistors may be employed instead. Fundamentally, they are fabricated by a CMOS process. To increase operating speed, a Bi-CMOS process in which bipolar transistors are also fabricated can be alternatively utilized.

In the present invention, a DRAM portion and a flash memory portion are formed on the main surface of the same semiconductor substrate. Therefore, when the semiconductor device of the invention is used in an apparatus such as a computer, an increase in the speed of transferring data and decreases in number of components, weight, volume, and cost can be accomplished.

What is claimed is:

1. A semiconductor device comprising:
   a DRAM portion;
   a flash memory portion;
   said DRAM portion and said flash memory portion both being formed on a main surface of a common semiconductor substrate;
   a first insulation layer;
   said DRAM portion having a first capacitor with a first electrode separated from said main surface of said substrate by said first insulation layer;
   said flash memory portion having a floating gate separated from said main surface by said first insulation layer and formed of the same material as said first electrode; and
   said first insulation layer in said flash memory portion forming a tunnel oxide film.

2. A semiconductor device according to claim 1 wherein said DRAM portion has a second capacitor with a second electrode separated from said first electrode by a second insulating layer, and a transistor with a gate electrode, and said flash memory portion has a control gate separated from said floating gate by said second insulating layer, said second electrode, gate electrode and control gate being formed of the same material.

3. A semiconductor device according to claim 2 wherein said substrate has a first heavily doped layer in said main surface connected to said second electrode via a hole in at least a part of said second insulating layer.

4. A semiconductor device according to claim 3 wherein said substrate has a second heavily doped layer in said main surface connected to said first electrode via a hole in said first insulating layer.

5. A semiconductor device comprising:
   a DRAM portion having a first transistor and a flash memory portion having a second transistor;
   said DRAM portion and said flash memory portion being formed on a main surface of a common substrate;
   said first transistor and said second transistor being separate such that a drain of said first transistor and a drain of said second transistor are separated apart;
   said DRAM portion having a first capacitor with a first electrode separated from said main surface of said substrate by a first insulation layer of said first capacitor;

said second transistor having a floating gate separated from said main surface of said substrate by a first insulation layer of said second transistor; and said first insulation layer of said first capacitor and said first insulation layer of said second transistor being formed of the same material.

6. A semiconductor device comprising:

a DRAM portion having a first transistor and a flash memory portion having a second transistor;

said DRAM portion and said flash memory portion being formed on a main surface of a common substrate;

said first transistor and said second transistor being separate such that a drain of said first transistor and a drain of said second transistor are separated apart;

said DRAM portion having a first capacitor with a first electrode separated from said main surface of said substrate by a first insulation layer of said first capacitor;

said DRAM portion having a second capacitor with a second electrode separated from said first electrode by a second insulation layer of said first capacitor;

said second transistor having a floating gate separated from said main surface of said substrate by a first installation layer of said second transistor;

said second transistor having a control gate separated from said floating gate by a second insulation layer of said second transistor; and said second insulation layer of said first capacitor and said second insulation layer of said second transistor being formed of the same material.

7. A semiconductor device comprising:

a DRAM portion having a first transistor and a flash memory portion having a second transistor;

said DRAM portion and said flash memory portion being formed on a main surface of a common substrate;

said first transistor and said second transistor being separate such that a drain of said first transistor and a drain of said second transistor are separated apart;

said DRAM portion having a first capacitor with a first electrode separated from said main surface of said substrate by a first insulation layer of said first capacitor;

said DRAM portion having a second capacitor with a second electrode separated from said first electrode by a second insulation layer of said first capacitor;

said second transistor having a floating gate separated from said main surface of said substrate by a first insulation layer of said second transistor;

said second transistor having a control gate separated from said floating gate by a second insulation layer of said second transistor; and said second electrode and said control gate being formed of the same material.

* * * * *